United States Patent [19]
Braendle et al.

[11] Patent Number: 5,709,784
[45] Date of Patent: Jan. 20, 1998

[54] PROCESS AND APPARATUS FOR WORKPIECE COATING

[75] Inventors: Hans Braendle, Sargans, Switzerland; Bruno Kind, Triesen, Liechtenstein

[73] Assignee: Balzers Aktiengesellschaft, Liechtenstein

[21] Appl. No.: 710,095

[22] Filed: Sep. 11, 1996

[30] Foreign Application Priority Data

Mar. 11, 1996 [CH] Switzerland .................... 627/6

[51] Int. Cl.$^6$ ............... C23C 14/34; C23C 14/32
[52] U.S. Cl. .................. 204/192.38; 204/298.41; 204/298.26; 204/298.28; 204/298.36
[58] Field of Search ............ 204/192.12, 192.32, 204/192.34, 192.38, 298.23, 298.26, 298.28, 298.31, 298.35, 298.36, 298.41

[56] References Cited

U.S. PATENT DOCUMENTS

| | | | |
|---|---|---|---|
| 4,448,802 | 5/1984 | Buhl et al. | 204/298.41 X |
| 4,529,475 | 7/1985 | Okano et al. | 204/298.36 X |
| 4,574,179 | 3/1986 | Masuzawa et al. | 204/298.36 X |
| 4,877,505 | 10/1989 | Bergmann | 204/298.41 X |
| 4,885,068 | 12/1989 | Uramoto et al. | 204/298.41 X |
| 5,234,561 | 8/1993 | Randhawa et al. | 204/298.41 X |

*Primary Examiner*—Nam Nguyen
*Attorney, Agent, or Firm*—Notaro & Michalos P.C.

[57] ABSTRACT

An arrangement and process for sputter etching high-performance tools with a low-voltage arc discharge is followed by coating the tools from the same direction from which they were etched, with a hard coating deposited onto the tools.

20 Claims, 4 Drawing Sheets

FIG. 4a
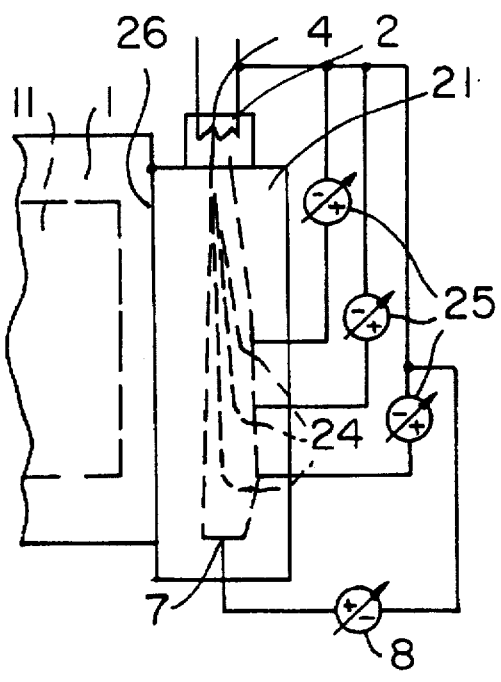
FIG. 4b
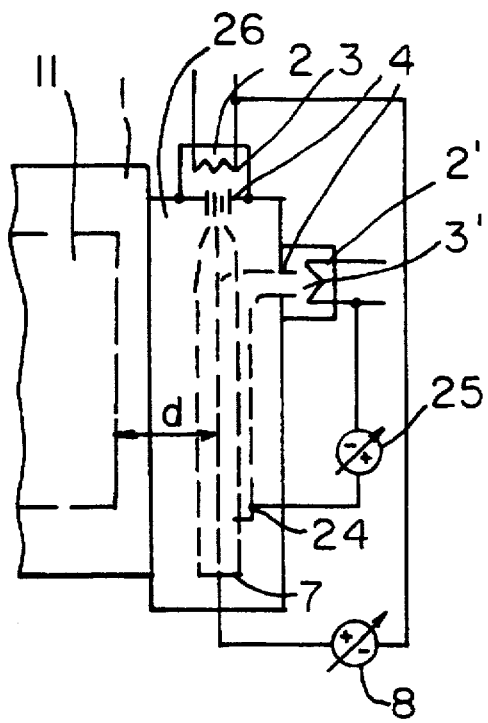
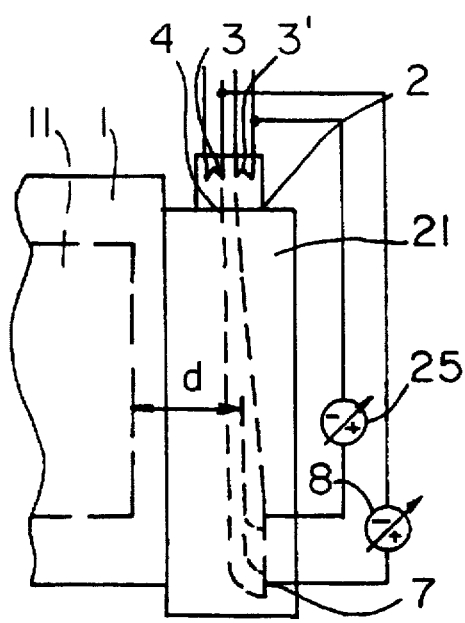
FIG. 4c

PROCESS AND APPARATUS FOR WORKPIECE COATING

BACKGROUND OF THE INVENTION

The present invention relates to a coating arrangement as well as a process for coating workpieces.

In many known vacuum treatment processes, cleaning of the workpiece surface is performed prior to vacuum coating. In addition, the workpieces may be heated to the desired temperature before or after the cleaning step. Such steps are principally needed to ensure adequate bonding strength of the coating to be deposited. This is especially important in applications where workpieces, and tools in particular, are to be coated with a wear protection coating. On tools such as drills, milling cutters, broaches and shaping dies such coatings are subjected to very high mechanical and abrasive stress. An extremely good bond with the substrate is, therefore, essential for useful and economical use. A proven method for pre-treating such tools is heating with electron bombardment, and etching by means of ion etching, for example, sputter etching. Heating by means of electron bombardment from a plasma discharge is known, for example, from DE 33 30 144.

A plasma discharge path can also be used for creating heavy noble gas ions, for example, argon ions, which are accelerated from this plasma toward the workpiece or the substrate on which they cause sputter etching as described in DE 28 23 876.

In addition to sputter etching another known technique is to operate plasma discharges with additional reactive gases and to etch the workpieces chemically, however, also process techniques combining reactive etching and sputter etching are feasible. The objective of all these pre-treatment processes is to prepare the workpiece surface in such a way that the subsequently deposited coating adheres well to the substrate.

For plasma generation the aforementioned arrangements use a low-voltage arc discharge that is arranged in the central axis of the apparatus whereas the workpieces are arranged at a certain distance around this arc along a cylindrical surface. The coating is subsequently deposited by means of thermal evaporation or sputtering. Depending on the process management, an additional ion bombardment is generated during the coating through a corresponding substrate bias, a technique which is known as in plating. The advantage of this arrangement is that large ion currents with small particle energy can be drawn from the low-voltage arc which affords gentle treatment of the workpiece. The disadvantage is, however, that the workpieces must be arranged in a zone defined radially to the discharge and that as a rule they must be rotated round the central axis as well as their own axis in order to achieve uniform and reproducible results.

Another disadvantage is that due to the relatively narrow admissible cylindrical processing band width either the processable workpiece size is limited or the batch size is limited for a large number of small workpieces which severely limits the cost-effectiveness of the known arrangements. This limitation is due to the fact that the low-voltage arc discharge which centrally penetrates the process chamber requires a certain dimension for itself. In order to produce good and reproducible results, the workpieces must have a suitable distance from the discharge which means that a large portion of the central process chamber space cannot be utilized.

Also known are sputtering arc arrangements with so-called diode discharges. Such diode discharges are operated with high voltages of up to 1000 Volt and even higher. Diode etching devices have proven to be unsuited to applications with demanding requirements. On the one hand the achievable etching rates and consequently the efficiency is low, and on the other hand these high voltages can produce defects on sensitive substrates. In particular workpieces that require three-dimensional processing such as tools cannot be readily processed by such an arrangement. Tools, for example, are designed with a number of fine cutting edges on which such discharges tend to concentrate, with the result that uncontrolled effects such as overheating and even destruction of the functional edge can occur or such fine edges and points.

In the patent application DE 41 25 365 an approach for solving the aforementioned problem is described. It assumes that the coating is deposited by means of a so-called arc evaporation process. In order to produce well-bonding coatings with such evaporators, the arc of the evaporator itself was used prior to the actual coating in such a way that the ions produced in the arc, particularly the metal ions, are accelerated out of the evaporation target toward the workpieces by means of a negative acceleration voltage of typically >500 Volt, but often also in the range of 800 to 1000 volt so that more material is sputtered off the workpiece than deposited. After this etching process the evaporator is operated as a coating source. The description mentions that in the usual processes based on the arc coating technology such high voltages are essential for producing well-adhering coatings through the arc evaporation process.

To prevent the problem of overheating or etching on uneven mass distribution or on fine workpiece geometries, the description proposes to operable, in addition to the arc plasma, an auxiliary discharge path with high voltage that causes supplementary ionization which is coupled to the evaporation arc. An additional DC source causes ions to be extracted from the plasma and accelerated to the workpiece and thereby produce the desired etching effect. An additional anode with another discharge path operated from a separate power supply is envisioned for increasing the effect. During the etching process the arc evaporator is operated with a closed shutter so that the substrate is shielded from the direct effect of the evaporator, thereby preventing so-called droplets on the substrate.

The disadvantage of the above arrangement is that it also requires a high voltage, that only limited processing homogeneities are achievable, and that through the coupling of the different plasma paths also the adjustment capabilities in the operating environments are limited. In addition this arrangement is very complicated and consequently costly to build and operate which seriously impairs the economy of a production system. The utilization of voltages in excess of 1000 Volt requires additional safety precautions.

Systems that are based on the current technology are not well suited to high throughputs if also high processing quality is required. Systems that accommodate coating widths of up to 1000 mm and more can be built only with great difficulty, if at all.

SUMMARY OF THE INVENTION

The purpose of the present invention is to eliminate the aforementioned disadvantages oil the current technology, in particular by creating a coating arrangement and by proposing a process that is suitable for depositing well-adhering coatings on a large number of workpieces, or on individual large workpieces with uneven mass distribution, without damaging the fine structures but with the desired homogeneity and the required highly economical processing rate.

This is achieved by designing the process arrangement mentioned at the beginning in accordance with the invention and by the coating process designed according to the invention.

Accordingly the workpiece surface to be coated is exposed to a plasma source designed as a hot cathode low-voltage arc discharge arrangement by transporting it transversely to the linear extent of the latter's discharge path. The workpiece is connected to a negative voltage so that ions are extracted from the arc discharge and accelerated to the workpiece, causing the latter to be sputter etched. Subsequently the workpiece is coated from the same side from which the low-voltage arc discharge was effective.

The preferred design variants of the coating arrangement conforming to the invention are described in the subsidiary claims.

Etching with a hot cathode low-voltage arc discharge arrangement as the ion source is particularly advantageous because such arc discharges can be operated with discharge voltages of <200 Volt which means that this process is not afflicted by the disadvantages of high-voltage etching. Etching with low-voltage arc discharges is also particularly harmless to the workpiece, that is, the fine structures on larger workpieces such as cutting edges are adversely affected neither by thermal overload nor edge rounding caused by high-energy ion bombardment.

Despite the relatively low discharge voltage in the working range of 30 to 200 Volt DC, but preferably within the range of 30 to 120 Volt, a very high discharge current of a few 10 to a few 100 ampere, preferably from 100 to 300 ampere, is feasible. This means that this type of discharge is able to produce a very high ion current at low energy. Due to the high ion current available, a high etching rate can be achieved on the substrate at a relatively low acceleration voltage, and as has been mentioned before, with gentle treatment of the workpiece. The extraction voltage or the acceleration voltage on the substrate is within the range of −50 Volt to −300 Volt, preferably within the range of −100 Volt to −200 Volt. The ion current drawn to the workpieces achieves values of 5 to 20 ampere, with a preferred working range from 8 to 16 ampere. The processing width for the workpiece or workpieces can be up to 1000 mm. With a somewhat more elaborate equipment design also larger processing widths are feasible. The achievable values depend not only on the operating values for the arc discharge but also on their geometric arrangement relative to the workpiece, as well as on the selected working pressure. Typical working pressures are of the order of $10^{-3}$ mbar. For operating the arc discharge a noble gas is used as the working gas, preferably a heavy noble gas such as argon.

In the past, low-voltage arc discharge arrangements were rotation symmetrical which means that the arc discharge was arranged in the center and the workpieces were rotated around this arc discharge located in the central axis. The assumption was that the rotation symmetrical arrangement with the centrally arranged arc discharge would offer the best possible result with respect to uniformity and speed of the etching operation. Surprisingly it has been shown, however, that the asymmetrical arrangement proposed by the invention is overall much more advantageous than the aforementioned rotation symmetrical arrangement. With a rotation symmetrical arrangement with the arc discharge in the central axis the placement of large volume workpieces is restricted toward the center by the arc discharge itself. In addition such workpieces have to be rotated not only around the central axis but also around their own axis so that after the etching process the etched workpiece surfaces can be coated immediately with the coating sources arranged on the chamber wall. Only in this way is adequate distribution of the etching process and the coating thickness ensured.

It has also been shown that the distance of the workpiece from the arc discharge is more critical in a rotation symmetrical arrangement than in an asymmetrical arrangement in which the workpiece is exposed only from one side toward the arc discharge.

In the apparatus according to the invention it is possible to pass large-volume workpieces in front of the arc discharge without additional rotation, with the result that the size of the process chamber can be kept within reasonable limits and the handling of heavy workpieces is greatly simplified. This has a significant influence on the economy of production systems. The arrangement according to the invention is advantageous not only for large-volume workpieces but it is also possible to accommodate and simultaneously process a correspondingly large number of smaller workpieces.

Another advantage of the arrangement according to the invention is that the etching apparatus no longer has to be constructed as an integral part of the process chamber because it needs to be arranged only in the area of the process chamber wall which means that it can be arranged as an elongated, smaller discharge chamber on the latter's outer wall so that far greater freedom is achieved in the design of the process chamber. It has even been found that this arrangement is far less critical with respect to the distance between the arc discharge and the workpiece surface, which means that higher reproducibility of the results is achieved with larger spacing variations that typically occur with larger workpieces. The total ion current that can be extracted from the arc discharge still reaches advantageously high values and can be concentrated fully on the workpieces, thereby producing the desired high etching rates. The actual separation of the low-voltage arc discharge or the plasma source from the process chamber or from the treatment zone also affords a higher degree of freedom in the design of this source and consequently a much more flexible adaptation of the source design to the process requirements than is the case with the integral rotation-symmetrical arrangement with discharge in the central axis of the equipment.

For depositing a well-bonding coating after the etching process, one or more additional evaporation sources acting from the same side are arranged on the process chamber wall. Particularly suited are sources that can be arranged in such a way that, like the elongated low-voltage discharge, they coat the workpieces transported in front of them across a correspondingly elongated area. Suited are sources such as sputtering sources or arc evaporation sources. Practice has shown that so-called cathodic spark evaporators or arc evaporators are particularly suited because well-bonding coatings can be economically produced by these and the preceding etching process. Test tools processed through this arrangement achieved a useful life that was significantly and reproducibly longer than achieved by known arc evaporated coatings with preceding high-voltage etching. For example, the useful life of cutting tools such as milling cutters was improved by a factor of at least 1.5; in particularly favorable cases ever by a multiple over conventional techniques. In addition a very homogenous etch distribution was achieved which is far less dependent on the workpiece geometry and also allows mixing of different substrates in a batch.

With the proposed arrangement it is also easily possible to implement processes not only with noble gases but also with chemically active gases because the low-voltage arc discharge activates gases such as $N_2$, $H_2$ very well. Unwanted parasitic discharges produced by insulating surfaces can be easily controlled with the low-voltage discharge. The low-voltage arc discharge is preferably operated with a separate cathode chamber or ionization chamber that accommodates a hot cathode and communicates with the discharge chamber or the process chamber only through a small opening. The gases are preferably admitted via this cathode chamber. This results in a certain gas separation between the process chamber and the coating sources which reduces or eliminates the problem of target contamination. With this arrangement it is also possible to perform activation on the workpiece with different process gases during the actual coating phase. The desired working conditions can be established by choosing a corresponding negative or even positive voltage on the workpiece.

As the workpieces generally have to be passed in front of the sources several times during a process step in order to achieve the necessary etching depth or coating thickness as well as uniform and reproducible treatment, it is advantageous to design the apparatus in such a way that the workpieces can be rotated around a central axis and to arrange the sources on the chamber wall in such a way that they all work from the outside toward the inside. In this case a very large workpiece can be arranged for processing in such a way that it rotates on its central axis. In the same space, however, also a large number of small workpieces, even of different size, can be arranged on a holder and passed across the sources while rotating around this central axis in order to achieve homogenous results. Such an arrangement is particularly compact and easy to build which is essential for an economical process.

The plasma source or the low-voltage arc discharge is preferably arranged on the process chamber wall, transversely to the transport direction. The low-voltage arc discharge device can, for example, and preferably be arranged in a box-like attachment, here in the form of a discharge chamber, which is connected to the process chamber by a long narrow opening in such a way that the low-voltage arc is arranged directly opposite the workpiece(s) or the zone to be processed. The low-voltage arc discharge is generated by an electrically heated or thermionic emission cathode and an anode arranged at a certain distance. A corresponding discharge voltage is applied to this anode, causing an arc current to be drawn. This discharge features a gas inlet port through which the arc discharge is supplied with the working gas. This arrangement is preferably operated with a noble gas such as argon, but as has been mentioned above, also reactive gases can be adored. The size of the discharge path should be at least 80% of the treatment zone width and be positioned relative to the treatment zone in such a way that the desired treatment distribution or homogeneity can be attained. To achieve the corresponding sputter etching on the workpiece, the latter or the workpiece holder is operated with a negative voltage relative to the arc discharge arrangement. Depending on the process, such as in reactive processes during the coating the arrangement can also be operated without such a voltage or even with a positive voltage, that is, with electron bombardment. Aside from a DC voltage also a medium or high-frequency AC voltage can be used, and also superposition of DC on AC is feasible. The DC voltage can also be pulsating, and it is possible to superpose only part thereof on the AC supply. With such a supply it is possible to control certain reactive processes. It also can in particular avoid or prevent parasitic arcs if dielectric zones exist or are formed on the equipment and the workpiece surfaces.

The desired distribution with respect to the processing zone can be set via the length of the discharge and its location. Another parameter for controlling the distribution is the plasma density distribution along the arc discharge. This distribution can e.g. be influenced with the aid of additional magnetic fields which are arranged in the area of the discharge chamber. For the setting and correction of the process parameters, permanent magnets are positioned along the discharge chamber. Better results are achieved, however, if the discharge path is operated with additional, separately powered anodes which are arranged along the discharge path in accordance with the distribution requirements. With such an arrangement even the distribution curve can be influenced to a certain degree. Preferred is, therefore, the arrangement without correction magnets and with more than one anode along the discharge path. However, it is also possible to combine this preferred arrangement with additional correction magnets. Additional anodes can be readily operated in combination with a single cathode. It is advantageous, however, to have an emission cathode opposite each anode in order to achieve optimum decoupling of these circuits which in turn improves the controllability.

The thermionic emission cathode is preferably arranged in a separate, small cathode chamber which communicates with the discharge chamber through a small opening. This cathode chamber is preferably equipped with an inlet port for noble gas. If desired also reactive gases can be admitted via this gas inlet. Preferably, reactive gases are not admitted into the cathode chamber but, four example, into the discharge chamber. Through the opening in the cathode chamber the electrons are drawn to the anode or anodes so that the gas which is a least partially ionized also emerges from this opening. The process chamber is preferably designed in such a way that the central axis around which the workpieces are rotating, is arranged vertically. The cathode or the cathode chamber is preferably arranged above the anode. In the cathode chamber the exit opening is preferably arranged downward. These arrangements simplify the entire handling of the system and help to avoid problems that can be caused by particle formation.

In addition to the low-voltage arc discharge arrangement the process chamber is equipped with at least one additional source, preferably in the form of an arc evaporator. These sources act radially in the same direction from the outside toward the central axis or the processing zone. It is advantageous if the low-voltage arc discharge is arranged before the coating source with respect to the transport direction. An arc evaporator, like the arc discharge arrangement, usually has a linear extent that is transverse to the transport direction so that the entire processing zone can be coated with the desired homogeneity. In the proposed coating arrangement several round arc evaporators are preferably used which are distributed along the chamber wall in such a way that the desired homogeneity is achieved. The advantage is that the high power consumption of the evaporator can be split up and that coating thickness distribution can be better controlled or to a certain degree be even adjusted by means of the power supply. If this way exceptionally high coating rates can be achieved which results in high economy. For example, a process for tools, particularly shaping dies, would be configured as follows:

PROCESS EXAMPLE

The system configuration corresponds to FIGS. 2 and 3. The tools are not rotated around their own axis but only passed in front of the sources by rotating the workpiece holder around its central axis. A coating zone with a width b of 1000 mm and a diameter d of 700 mm is formed, within which the workpieces are arranged. The process chamber has a diameter of 1200 mm and a height of 1300 mm.

Etching parameters:

| | |
|---|---|
| Low-voltage arc current | $I_{LVA} = 200$ A |
| Arc discharge voltage | $U_{LVA} = 50$ V |
| Argon pressure | $P_{Ar} = 2.0 \times 10^{-3}$ mbar |
| Etching current | $I_{sub} = 12$ A |
| Etching time | $t = 30$ min |
| Etching depth | 200 nm |

Coating:

| | |
|---|---|
| Current for each arc evaporator (8 evaporators with 150 mm diam. titanium targets) | $I_{ARC} = 200$ A |
| Arc discharge voltage | $U_{ARC} = 20$ V |
| Nitrogen pressure | $P_{N2} = 1.0 \times 10^{-2}$ mbar |
| Bias pressure | $U_{Bias} = -100$ V |
| Coating time | $t = 45$ min |
| Coating thickness TiN | 6 μm |

The process cycle time for one batch, including heating and cooling, is 150 min.

The voltage generation equipment for the negative acceleration voltage on the workpiece is usually operated with voltages of up to 300 Volt DC, but to protect the workpieces the voltage is preferably kept within the range of 100 to 220 Volt at which good etching rates are still feasible without defects. The low-voltage arc arrangement must be operated at least 10 cm away from the workpiece, but the distance should preferably be >15 cm, or preferably within the range of 15 to 25 cm at which high rates with a good distribution are achieved.

The coating system according to this invention is particularly suitable for processing tools such as drills, milling cutters and shaping dies. The holders and the transport device are designed specifically for this type of tools. The present coating arrangement is generally able to achieve good results even if the workpieces to be coated are rotated only around the central axis of the equipment. In particularly critical cases or if a very large number of small parts are to be loaded into the system, the rotation around the central axis can easily be supplemented in this design concept by adding additional rotating axes which in turn rotate around the central axis.

DESCRIPTION OF THE DRAWINGS

The invention is subsequently exemplified and schematically explained by means of the following illustrations:

FIG. 4a Cross-section of a part of the arrangement with discharge chamber for low-voltage arc discharge and multiple anodes arranged inside the chamber.

FIG. 4b Same as FIG. 4a but illustrated with separate cathode-anode discharge paths with the cathodes arranged in separate cathode chambers.

FIG. 4c Same as FIGS. 4a and 4b, also with separate cathode-anode discharge paths, but with the cathodes arranged in a common cathode chamber.

DESCRIPTION OF THE PREFERRED EMBODIMENT

Figure 1:
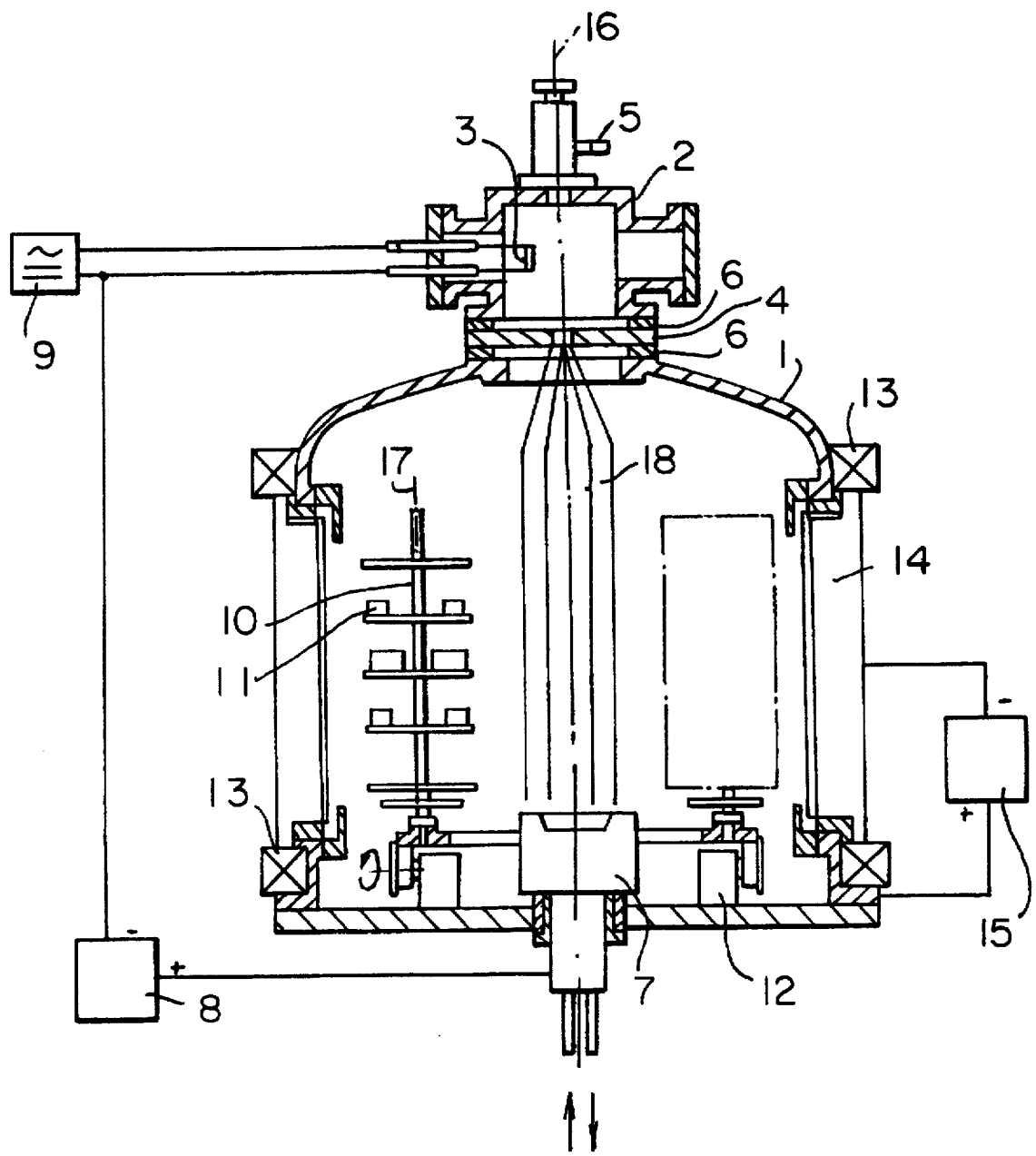
FIG. 1 A coating arrangement with low-voltage discharge according to the conventional technology. (State of the art).

FIG. 1 illustrates a known workpiece coating arrangement. A vacuum chamber serves as process chamber 1 for accommodating a low-voltage arc discharge 18 which runs in the center of vacuum chamber 1 along the latter's central axis 16 and to which magnetron sputtering sources 14 are flanged at the periphery from the outside to the chamber wall of process chamber 1. On the top of process chamber 1 there is a cathode chamber 2 that holds a thermionic hot cathode 3 which can be supplied via gas inlet 5 with the working gas, typically a noble gas like argon. For reactive processes also active gases can be added. Cathode chamber 2 communicates with process chamber 1 via a small hole in shutter 4. The cathode chamber is usually insulated from processing chamber by means of insulators 6. Shutter 4 is additionally insulated from the cathode chamber via insulator 6 so that shutter 4 can be operated on floating potential or auxiliary potential, as required. Anode is arranged in the direction of the central axis 16 on the opposite side of cathode chamber 2. Anode 7 can have the form of a crucible and holds the material to be evaporated by the low-voltage arc discharge. During the etching process this evaporation option is not used; only ions are extracted from the low-voltage arc discharge and accelerated toward the workpieces in such a way that that the latter are sputter etched. For operating the low-voltage arc discharge 18 cathode 3 is heated with a heater supply unit so that cathode 3 emits electrons. Between cathode 3 and anode 7 there is an additional power supply 8 for operating the arc discharge. It usually produces a positive DC voltage on anode 7 in order to sustain the low-voltage arc 18. Between arc discharge 18 and the chamber wall of processing chamber 1, workpiece holders are arranged that hold the workpieces 11 which can be rotated around their vertical central axis 17 in order to achieve adequate process uniformity. The workpiece holders 10 are supported on an additional workpiece holder arrangement 12 which is equipped with a rotary drive by which these workpiece holders 10 are rotated around the central axis 16. In this type of equipment it is additionally necessary to focus the low-voltage arc discharge 18 via additional coils 13, for example in the form of Helmholz coils. It is evident that the workpieces 11 can be processed with the low-voltage arc discharge 18, that ion bombardment occurs when a negative voltage is applied to the substrate, and that electron bombardment is possible by applying a positive substrate voltage. In this way the workpieces can be pretreated with the aid of a low-voltage arc discharge either by means of electron bombardment induced by heating, or through ion bombardment with sputter etching. Subsequently the workpiece 11 can be coated, either through evaporation of material from crucible 7 by means of the low-voltage arc, or through sputtering with magnetron sputter source 14 which is supplied by the power supply 15.

It is readily apparent that the mechanical assembly for substrate movement and the arrangement of the low-voltage arc discharge are rather complex in this layout. On the other hand the degree of freedom is severely restricted because the workpieces can only be arranged between the low-voltage arc discharge located in the center and the outer chamber wall. A system of this type is uneconomical to operate for large workpieces or large batch quantities.

Figure 2:
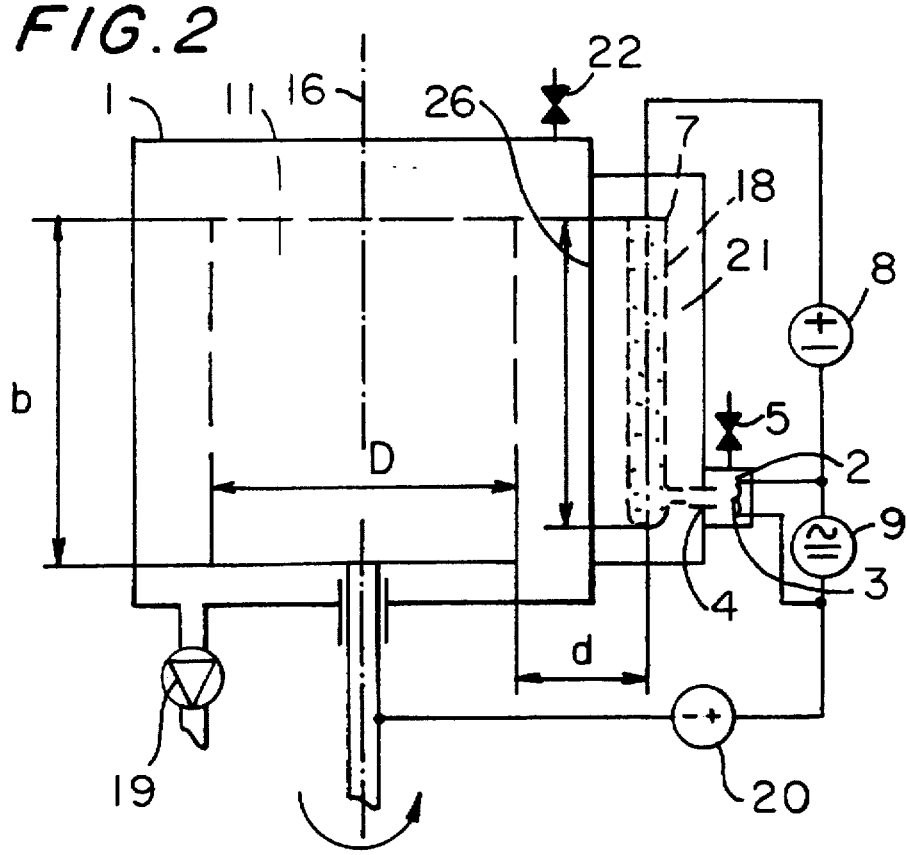
FIG. 2 Cross-section of a typical coating system according to the inventions, with peripheral discharge chamber for low-voltage discharge FIG. 3 Horizontal section of the system illustrated in FIG. 2.

An example of a preferred coating arrangement according to the invention is illustrated as a cross-section in FIG. 2.

Process chamber 1 contains a workpiece or workpieces holder 11 which is arranged in such a way that the workpieces can be rotated around the central axis 16 of the process chamber. The chamber is usually pumped down by the vacuum pumps 19 that maintain the working pressures required for the process steps. In the proposed arrangement a large workpiece 11 which extends beyond the central axis 16 can, for example, be arranged in process chamber 1 in such a way that this large workpiece 11 can be processed by the sources arranged on the process chamber wall. The zone available for loading the workpieces essentially fills process chamber 1 completely. In such an arrangement it is possible to position either a single large workpiece 11 or a large number of smaller workpieces which essentially fill the chamber volume.

The workpiece holder that rotates the workpieces 11 around the central axis 16, spans coating width b transversely to the rotation direction. In the system according to the invention it is particularly advantageous that uniform and reproducible coating results can be achieved either across large coating widths b or across a large depth range that extends from the central axis 16 to the periphery of the coating width, that is, within the entire diameter D. Based on the known concentric arrangement according to the conventional technology in which these conditions were critical, it was not to be expected that an eccentric arrangement according to the present invention would produce better results. A large variety of workpiece geometries with fine edges and cutting edges can be handled in this large area without problems related to thermal stress or unwanted occurrence of arcs.

On the outer wall of the process chamber the etching and coating sources are positioned in such a way that they all act from the outside toward the workpieces. For the important preparatory sputter etching process the chamber wall features a slot shaped opening, the length of which corresponds at least to processing width b. Behind this opening 26 there is a box shaped discharge chamber 21 in which the low-voltage arc discharge 18 is generated. This low-voltage arc discharge 18 runs essentially parallel to processing width b and has an effective length which shall be at least 80% of processing width b. Preferably the discharge length should be equal to the processing width b or extend even beyond it.

The axis of arc discharge 18 has a selected distance d from the nearest processing zone, that is, the next workpiece section. This distance d shall be at least 10 cm, preferably 15 to 25 cm. This results in good process uniformity and a high sputtering rate can be maintained. In the lower part of discharge chamber 21, cathode chamber 2 is flanged on which communicates with discharge chamber 21 via orifice 4. Cathode chamber 2 contains a hot cathode 3 which is supplied via the heating power supply unit 9. This supply can be operated with AC or DC. Cathode chamber 2 features a gas inlet port 5 for supplying the working gas, normally a noble gas like argon, or a noble gas—active gas mixture for certain reactive processes. It is also possible to admit working gases via process chamber 1 by means of auxiliary gas inlet 22. Active gases are preferably admitted directly into process chamber 1 via gas inlet 22.

In the upper part of discharge chamber 21 there is an electrode 7 which is designed as a anode. DC supply 8 is connected between cathode 3 and anode 7 in such a way that the positive pole is on anode 7 and a low-voltage arc discharge can be drawn. By applying a negative voltage to the workpiece holder or to the workpieces 11 with the aid of voltage generator 20 between the low-voltage arc discharge arrangement and the workpiece 11, argon ions are accelerated toward the workpieces so that the surface is sputter etched. This can be achieved with accelerating voltages of up to 300 Volt DC, but preferably with a voltage in the range of 100 Volt to 200 Volt to ensure gentle processing of the workpieces 11. The process uniformity can be set through appropriate positioning of cathode chamber 2, and by arranging anode 7 relative to processing width b of the workpieces to be processed in accordance with the process specifications. Another factor is the shape of anode 7 The latter can, for example, have either a flat, dished, or rectangular shape, or be designed as a tubular, cooled anode.

Figure 3:
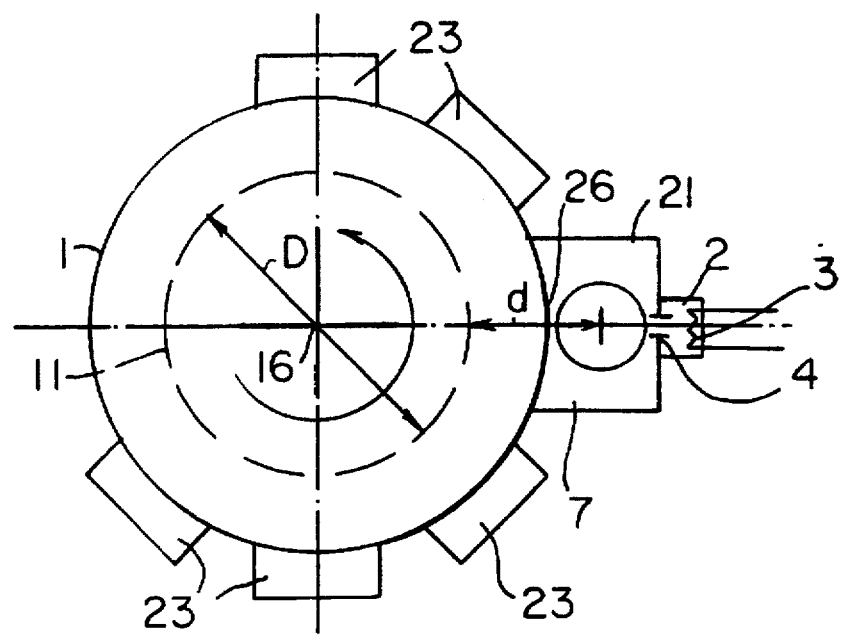

FIG. 3 shows a horizontal cross-section of the system based on FIG. 2. Shown is again the box-like discharge chamber 21 on the outer wall of process chamber 1 which communicates with the treatment zone in chamber 1 through slot opening 26. Of course, several such discharge chambers can be arranged on a system as required, for example to further boost the processing effect. Also illustrated are the evaporation sources 23 which are flanged to the chamber wall. For example, magnetron sputter sources can be used as evaporation sources 23 but for achieving high processing speeds at low costs, so-called arc evaporation sources are preferably used. The advantage of this arrangement is that the arc evaporation sources 23 can be freely arranged from the outside in such a way that through the distributed arrangement of multiple sources the desired coating homogeneity can be set and a high coating rate can be maintained. It has been shown that it is more advantageous not to use single, rectangular evaporation sources but several smaller, round sources that are arranged on the periphery of the system in accordance with the process requirements. Coating sources 23 thus act on the workpieces in the processing zone in chamber 1, in the same direction as low-voltage arc discharge source 18, 21, with respect to the workpiece position or transport direction. This acting direction d is transverse to the axis 16 and to the rotation direction, and is transverse to the coating width direction b.

FIG. 4a illustrates another advantageous variant of the arrangement according to the invention in which cathode chamber 2 is located on the top of discharge chamber 21. The advantage is that the operating of the discharge path is least disturbed by particles which always occur in such a coating system. Also shown is a the possibility of subdividing the discharge path by using several anode-cathode circuits and making the intensity along discharge 1 adjustable. The main discharge is generated with power supply 8 between main anode 7 and cathode chamber 2. Additional ancillary discharges can be generated with auxiliary anodes 24 and auxiliary power supplies 25. In this way it is possible to adjust the power density of the discharge along the entire discharge path between anode 7 and cathode 2 locally and with respect to the intensity to the homogeneity requirements of the workpiece.

FIG. 4b shows an alternative arrangement. The anode-cathode paths can be kept completely apart, or even decoupled by using separate anodes 7, 24, separate cathodes 3, 3', and separate cathode chambers 2, 2'. Another version is illustrated in FIG. 4c in which two separates anodes 7, 24 are used, but a common cathode chamber 2 with two hot cathodes 3 and 3'.

Figure 5:
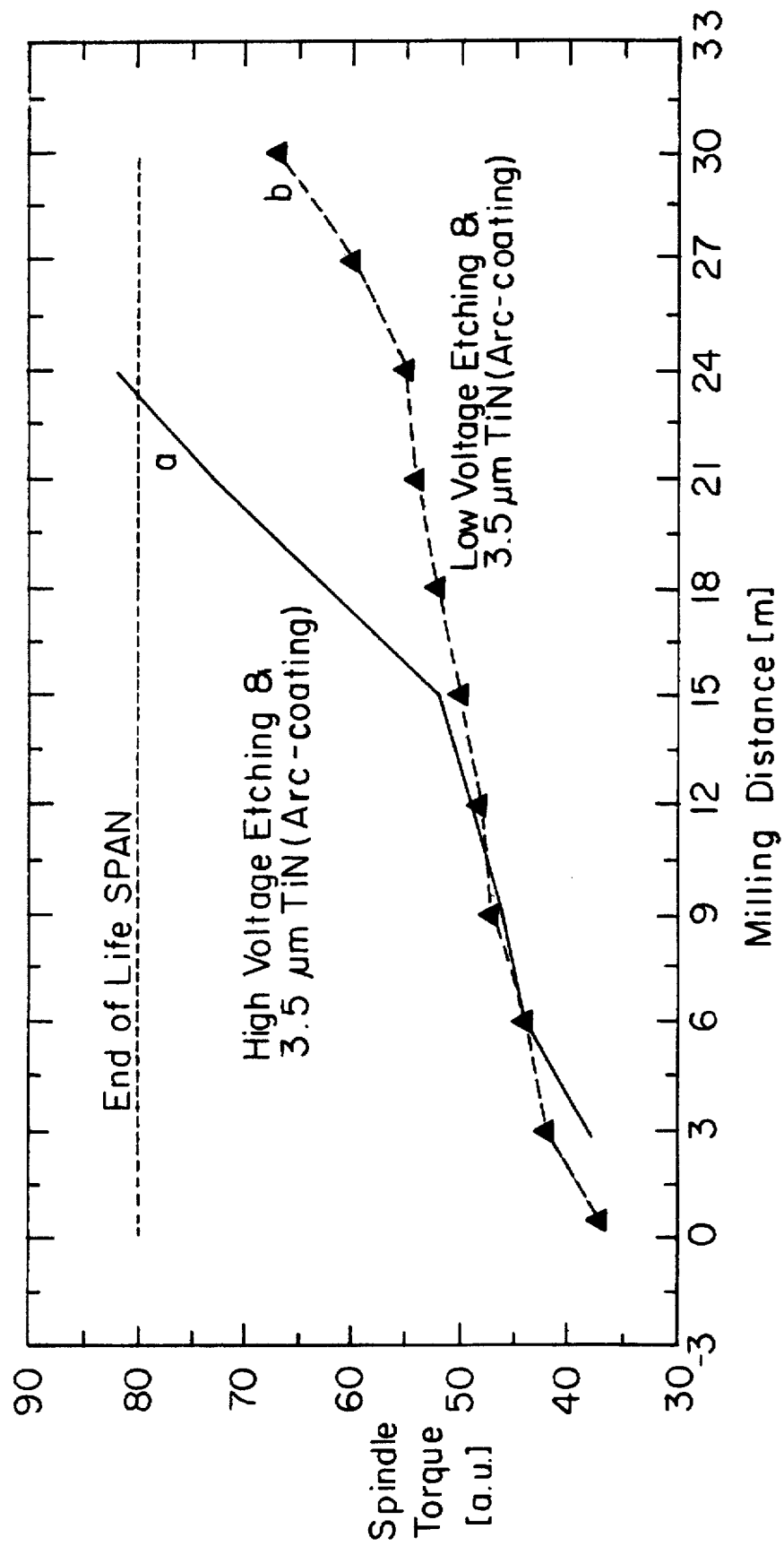
FIG. 5 Service life comparison curves for tools coated with the conventional technology and the technology according to the present invention.

FIG. 5 illustrates the test results of HSS finish milling cutters that were processed according to the invention (curve b) and the conventional technology (curve a). In both cases the milling cutters were given a 3.5 μm TiN coating. For the milling cutter according to the conventional technology (curve a) high-voltage etching was first performed in the conventional manner whereas for the milling cutter represented by curve b the proceeds according to the invention was used. The test conditions were as follows:

| HSS finish milling cutter: | Diam. 16 mm |
|---|---|
| Number of teeth: | 4 |
| Test material: | 42 CrMo4 (DIN 1.7225) |
| Hardness: | HRC 38.5 |
| Infeed: | 15 mm × 2.5 mm |
| Cutting speed | 40 m/min |
| Feed per tooth | 0.088 mm |
| Feed | 280 mm/min |
| End of life: | Spindle torque 80 (arbitrary unit) |

The result shows clear improvements in the life of the tool treated according to the invention. An improvement by a factor of 1.5 or more is easily reached. Important is not only the extension of the tool life but also the flatter progressing of the torque curve which is indicative of the deterioration in tool quality toward the end of the tool life. In the example according to FIG. 5 this is clearly recognizable at a total milling depth of 15 m. Curve a which represents the conventional technology shows a sharp degradation in tool quality at a total milling depth of 15 m. This shows that the cutting quality achievable with the conventional technology has a greater variance across the entire tool life which means that it is not very consistent. Systems built in accordance with the invention as illustrated in FIGS. 2 to 4 achieve far greater throughputs with the aforementioned high, quality than system 1 which conforms to the conventional technology. Throughputs can easily be doubled or even increased by a factor of 3 to 5 which dramatically increases the economy.

We claim:

1. A coating arrangement for coating workpieces (11) in a processing zone and with a vacuum process chamber (1), comprising:
   a holding device for one of positioning the workpieces in the processing zone of the process chamber and for moving the workpieces in a transport direction in the process chamber;
   a plasma source arrangement mounted to the process chamber for generating an arc discharge (18), the plasma source arrangement having an active direction;
   a coating source (23) mounted to the process chamber and having an active direction;
   said holding device defining a treatment width (b) for positioning the workpieces or for passing the workpieces in the transport direction in front of said plasma source arrangement and said coating source;
   said plasma source arrangement and said coating source both being positioned at a selected distance (d) from the holding device with the workpieces, and both having the same active direction with respect to the holding device and the position of the workpieces or to the transport direction of the workpieces; said plasma source arrangement comprising a hot cathode low-voltage discharge arrangement having an active extent (1) which is transverse to the active direction and which substantially corresponds to the treatment width (b), and a field device for generating an electrical field (20) between the disc discharge (18) and workpieces (11) of the holding device.

2. A coating arrangement according to claim 1 wherein said holding device comprises means for rotating the workpieces around a central axis (16) in the process chamber (1), said plasma source arrangement and said coating source both being mounted to the process chamber so that the active directions of said plasma source arrangement and of said coating source are radial with respect to said central axis (16) and toward said central axis.

3. A coating arrangement according to claim 2 wherein the central axis comprises a vertical axis, the plasma source arrangement comprising a cathode chamber (2), a thermionic emission cathode (3) in the cathode chamber, a discharge chamber (21) connected to the cathode chamber and to the process chamber, and an anode (7) in the discharge chamber below the emission cathode, the cathode chamber including a downwardly extending opening (4) for communicating the cathode chamber with the discharge chamber.

4. A coating arrangement according to claim 1 wherein the plasma source arrangement comprises a discharge chamber (21) mounted to the process chamber (1), a thermoionic emission cathode (3) operatively connected to the discharge chamber, an anode (7) in the discharge chamber for generating a low-voltage discharge, a noble gas port (5) in the discharge chamber (21) for supplying a noble gas to the discharge chamber, a voltage generator (20) connected to the thermionic emission cathode to the anode and to the workpieces so that the workpieces comprise a negative pole and so that the plasma source arrangement functions as a sputter-etching device; the cathode, the anode and the cathode forming the hot cathode low-voltage discharge arrangement and the voltage generator comprising the field device (20) for generating an electrical field.

5. A coating arrangement according to claim 4, including at least one additional anode (24) in the discharge chamber and extending along the active extend (1) and at a selected distance from the active extent of the plasma source arrangement, the additional anode being between the emission cathode and the first mentioned anode for adjusting a plasma density distribution along the arc discharge (18).

6. An arrangement according to claim 5 including an additional cathode (3') for said additional anode (24) and a separate adjustable power supply (8,25) connected between the first mentioned cathode and the first mentioned anode, and between the additional cathode and the additional anode.

7. A coating arrangement according to claim 4 including a cathode chamber (2) connected to the discharge chamber (21), the emission cathode (3) being mounted in the cathode chamber, the noble gas port being arranged in the cathode chamber and an opening (4) communicating the cathode chamber with the discharge chamber for passage of the noble gas into the discharge chamber.

8. A coating arrangement according to claim 1 wherein the coating source (23) comprises an arc evaporator mounted to the process chamber adjacent to the plasma source arrangement and on one side of the plasma source arrangement with respect to the transport direction of the workpieces.

9. A coating arrangement according to claim 1 wherein the field device comprises a voltage generator (20) for generating a voltage of up to 300V DC, between the workpieces and the plasma source arrangement.

10. A coating arrangement according to claim 9 wherein the voltage generator generates voltage in the range of about 100–200 V.

11. A coating arrangement according to claim 1 wherein the selected distance (d) between the plasma source arrangement and the holding device for the workpieces is at least 10 cm.

12. A coating arrangement according to claim 11 wherein the selected distance (d) is from about 15 to about 25 cm.

13. A coating arrangement according to claim 1 wherein said holding device is adapted for holding workpieces comprising tools.

14. A coating arrangement according to claim 13 wherein the holding device is adapted for holding at least one of drills, milling cutters and shaping dies.

15. A coating arrangement according to claim 1 wherein the plasma source arrangement includes a discharge chamber (21) and means for generating a magnetic field in the discharge chamber for adjusting a plasma density distribution of the arc discharge (18).

16. An arrangement according to claim 1 wherein the plasma source arrangement comprises a discharge chamber (21) mounted to the process chamber and an opening communicating the discharge chamber with the process chamber having a width substantially equal to the treatment width (b) for fully exposing the processing zone containing the workpieces to the arc discharge (18).

17. A process for at least partly coating workpieces (11) in a processing zone of a vacuum process chamber (1), comprising:

at least one of holding the workpieces in a selected position in the processing zone and moving the workpieces in a transport direction in the processing zone, the workpieces being treated along a treatment width (b) in the processing zone while the workpieces are in the position or moved in the transport direction;

generating a hot cathode low-voltage arc (18) using a plasma source arranged on the process chamber, the arc having an active extent (1) transverse to the transport direction and extending across at least about 80 percent of the treatment width (b), the hot cathode, low-voltage arc being generated at a selected distance (d) from the workpieces;

operating a coating source (23) on the process chamber for coating the workpieces in an active direction which is transverse to the transport direction, the low-voltage arc having an active direction and the active direction of the low voltage arc and of the coating being on a same side of the workpieces with respect to the workpiece position or the transport direction; and applying a voltage between the low voltage arc discharge and the workpieces for extracting charge carriers from the low voltage arc so that the charge carriers are accelerated in the active direction of the low voltage arc toward the workpieces.

18. A process according to claim 17 including rotating the workpieces around a central axis for moving the workpieces in the transport direction past the plasma source arrangement and past the coating source, from the same side of the workpiece, the process including bombarding the workpieces using the low voltage arc followed by coating the workpieces using the coating source, as the workpieces move in the transport direction.

19. A process according to claim 17 wherein the charge carriers consist of ions extracted from the arc and using a negative workpiece voltage for directing the ions toward the workpieces for sputter etching the workpieces.

20. A process according to claim 17 including selecting the length of the active extent (1) arc and of the selected distance (d) between the arc and the workpiece for adjusting a distribution of etching caused by the low voltage arc across the workpieces.

* * * * *